US012805091B2

(12) United States Patent
Lin et al.

(10) Patent No.: US 12,805,091 B2
(45) Date of Patent: Nov. 17, 2026

(54) MICRO LIGHT-EMITTING DIODE DISPLAY DEVICE

(71) Applicant: PlayNitride Display Co., Ltd., Zhunan Township (TW)

(72) Inventors: Ching-Liang Lin, Zhunan Township (TW); Yi-Ru Huang, Zhunan Township (TW); Yun-Li Li, Zhunan Township (TW)

(73) Assignee: PlayNitride Display Co., Ltd., Miaoli County (TW)

( * ) Notice: Subject to any disclaimer, the term of this patent is extended or adjusted under 35 U.S.C. 154(b) by 385 days.

(21) Appl. No.: 18/670,976

(22) Filed: May 22, 2024

(65) Prior Publication Data

US 2025/0318336 A1 Oct. 9, 2025

(30) Foreign Application Priority Data

Apr. 3, 2024 (TW) ................................ 113112853

(51) Int. Cl.

*H01L 33/62* (2010.01)
*H10H 20/857* (2025.01)
*H10W 90/00* (2026.01)

(52) U.S. Cl.

CPC .......... *H10H 20/857* (2025.01); *H10W 90/00* (2026.01)

(58) Field of Classification Search

CPC ............................ H10H 20/857; H10W 90/00
See application file for complete search history.

(56) References Cited

U.S. PATENT DOCUMENTS

2022/0246792 A1* 8/2022 Liao ....................... H10D 86/40
2024/0306464 A1* 9/2024 Liu ...................... H10K 59/122

* cited by examiner

*Primary Examiner* — Jaehwan Oh
(74) *Attorney, Agent, or Firm* — MUNCY, GEISSLER, OLDS & LOWE, P.C.

(57) ABSTRACT

In a micro LED display device, a circuit pattern includes multiple first and second circuits. At least one of multiple sub-pixel units includes a first light-emitting element and a second light-emitting element. The first light-emitting element has a first electrode connected to one first circuit and a second electrode connected to one second circuit. The projection of at least one of the first electrode and the second electrode on the circuit substrate is away from the projection of electrically connected first or second circuit. The second light-emitting element has a luminous color the same as that of the first light-emitting element, and is electrically connected to one of the first circuits and one of the second circuits and in parallel with the first light-emitting element. The projection of the second light-emitting element on the circuit substrate overlaps with the projection of electrically connected first and second circuits.

14 Claims, 10 Drawing Sheets

MICRO LIGHT-EMITTING DIODE DISPLAY DEVICE

CROSS REFERENCE TO RELATED APPLICATIONS

This Non-provisional application claims priority under 35 U.S.C. § 119(a) on Patent Application No(s). 113112853 filed in Taiwan, Republic of China on Apr. 3, 2024, the entire contents of which are hereby incorporated by reference.

BACKGROUND

Technology Field

The present disclosure relates to a display device and, in particular, to a micro LED display device having repairing chips.

Description of Related Art

Micro LED display is a display technology that includes miniaturized and matrixed light-emitting chips on a driving substrate, and directly uses the lights emitted by the light-emitting chips to form pixel images. Compared with OLED (organic light-emitting diode) display technology, which is also self-luminous, the micro LED displays can solve the most fatal burn-in problem in OLED displays due to the different materials used. In addition, the micro LED displays also have the advantages of lower power consumption, high contrast, wide color gamut, high brightness, small size (thin and light), and energy saving. Therefore, major manufacturers around the world are rushing to invest in the research and development of micro LED display technology.

However, the pixel structure of micro LED display device cannot be manufactured by full-area coating that is used to manufacture OLED display devices. To manufacturing micro LED display device, the epitaxial substrate must be separated into a plurality of light-emitting chips, and then the light-emitting chips are transferred to a display substrate. In addition, as the demand for resolution increases, the size of micro LED chips is correspondingly further reduced. These factors make the photolithography process of flip-chip (FC) structures more difficult (e.g. electrodes), which decreases the production yield. At the same time, the difficulty of mass transferring and repairing of chips has increased accordingly.

One of the current solutions for high-resolution micro LED display devices is the vertical chip (VC) technology. Although it can solve the problems caused by the flip-chip process, the conductive wires for connecting electrodes (e.g. ITO circuit) must be formed by the photolithography process after the chips are transferred. In particular, if vertical chips are also used in the subsequent repairing stage, the above-mentioned conductive wires for connecting the electrodes must be formed again, resulting in the increases in manufacturing time and cost.

Therefore, it is desired to provide a micro LED display device that can simultaneously solve the problems of reduced production yield of flip-chip processes under high resolution design and increased manufacturing time and cost for vertical chip repairing.

SUMMARY

In view of the foregoing, the present disclosure is to provide a micro LED display device that can simultaneously solve the problems of reduced production yield of flip-chip processes under high resolution design and increased manufacturing time and cost for vertical chip repairing.

To achieve the above, a micro LED display device of this disclosure includes a circuit substrate, a circuit pattern and a plurality of sub-pixel units. The circuit pattern is disposed on the circuit substrate and includes a plurality of first circuits and a plurality of second circuits. The electrical properties of the first circuits are different from the electrical properties of the second circuits. The sub-pixel units are respectively arranged on the circuit pattern. At least one of the sub-pixel units includes at least one first light-emitting element and a second light-emitting element. The first light-emitting element includes a first electrode and a second electrode. The first electrode is electrically connected to one of the first circuits, the second electrode is electrically connected to one of the second circuits, and the projection of at least one of the first electrode and the second electrode on the circuit substrate is away from the projection of the electrically connected first circuit or the electrically connected second circuit on the circuit substrate. The luminous color of the second light-emitting element is the same as the luminous color of the first light-emitting element, and the second light-emitting element is electrically connected to one of the first circuits and one of the second circuits and is connected in parallel with the first light-emitting element. The projection of the second light-emitting element on the circuit substrate is overlapped with the projection of the electrically connected first circuit and the electrically connected second circuit on the circuit substrate.

To achieve the above, a micro LED display device of this disclosure includes a circuit substrate, a circuit pattern and a plurality of sub-pixel units. The circuit pattern is disposed on the circuit substrate and includes a plurality of first circuits and a plurality of second circuits, and the electrical properties of the first circuits are different from the electrical properties of the second circuits. The sub-pixel units are respectively arranged on the circuit pattern, and at least one of the sub-pixel units includes a first light-emitting element and a second light-emitting element. The first light-emitting element is electrically connected to one of the first circuits and one of the second circuits. The first light-emitting element includes two sub first light-emitting elements, and the projections of the sub first light-emitting elements on the circuit substrate are overlapped with the projections of the electrically connected first circuit and the electrically connected second circuit on the circuit substrate, respectively. The luminous color of the second light-emitting element is the same as a luminous color of the first light-emitting element. The second light-emitting element is electrically connected to one of the first circuits and one of the second circuits, and is connected in parallel with the first light-emitting element. The second light-emitting element includes two sub second light-emitting elements, and the projections of the sub second light-emitting elements on the circuit substrate are overlapped with the projections of the electrically connected first circuit and the electrically connected second circuit on the circuit substrate, respectively.

As mentioned above, in the micro LED display device of this disclosure, the projection of at least one of the first electrode and the second electrode of the first light-emitting element of the sub-pixel unit on the circuit substrate is away from the projection of the electrically connected first or second circuit on the circuit substrate, but the projection of the second light-emitting element on the circuit substrate is overlapped with the projection of the electrically connected first and second circuits on the circuit substrate. Based on this structural design, when the first light-emitting element in the sub-pixel unit of the micro LED display device is failed and the second light-emitting element is used to repair the failed first light-emitting element, it is unnecessary to manufacture the additional conductive circuits for connecting electrodes by photolithography process. Accordingly, this disclosure can simultaneously solve the problems of reduced production yield of flip-chip processes under high resolution design and increased manufacturing time and cost for vertical chip repairing.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

Figure 1A:
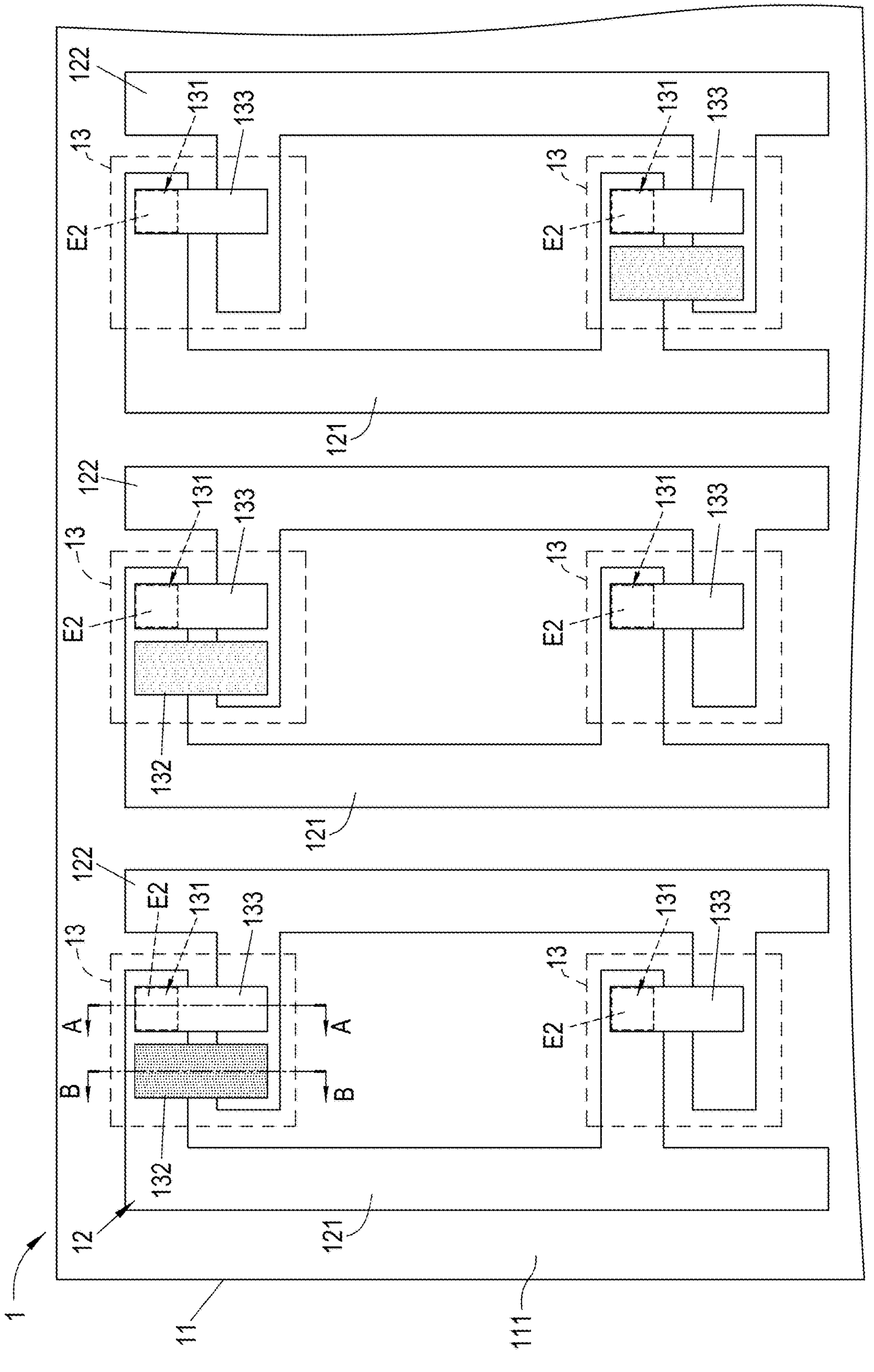
FIG. 1A is a top view of a micro LED display device according to an embodiment of this disclosure.

The present disclosure will be apparent from the following detailed description, which proceeds with reference to the accompanying drawings, wherein the same references relate to the same elements.

The components appearing in the drawings of the following embodiments are only used to illustrate the relative relationships thereof and do not represent the proportions or sizes of the actual components. In addition, the light-emitting element or light-emitting region presented in this disclosure can be a micro LED.

Figure 1B:
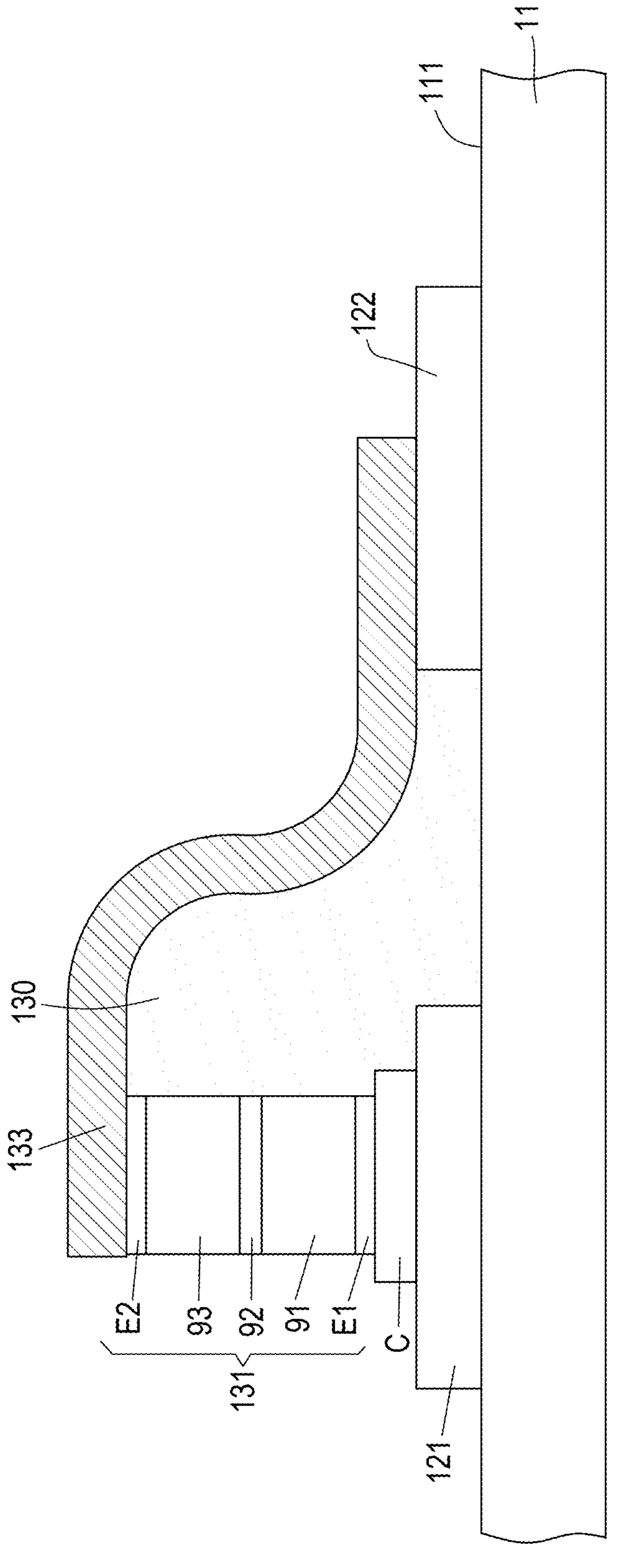
FIG. 1B is a sectional view of the micro LED display device of FIG. 1A along the line A-A.
Figure 1C:
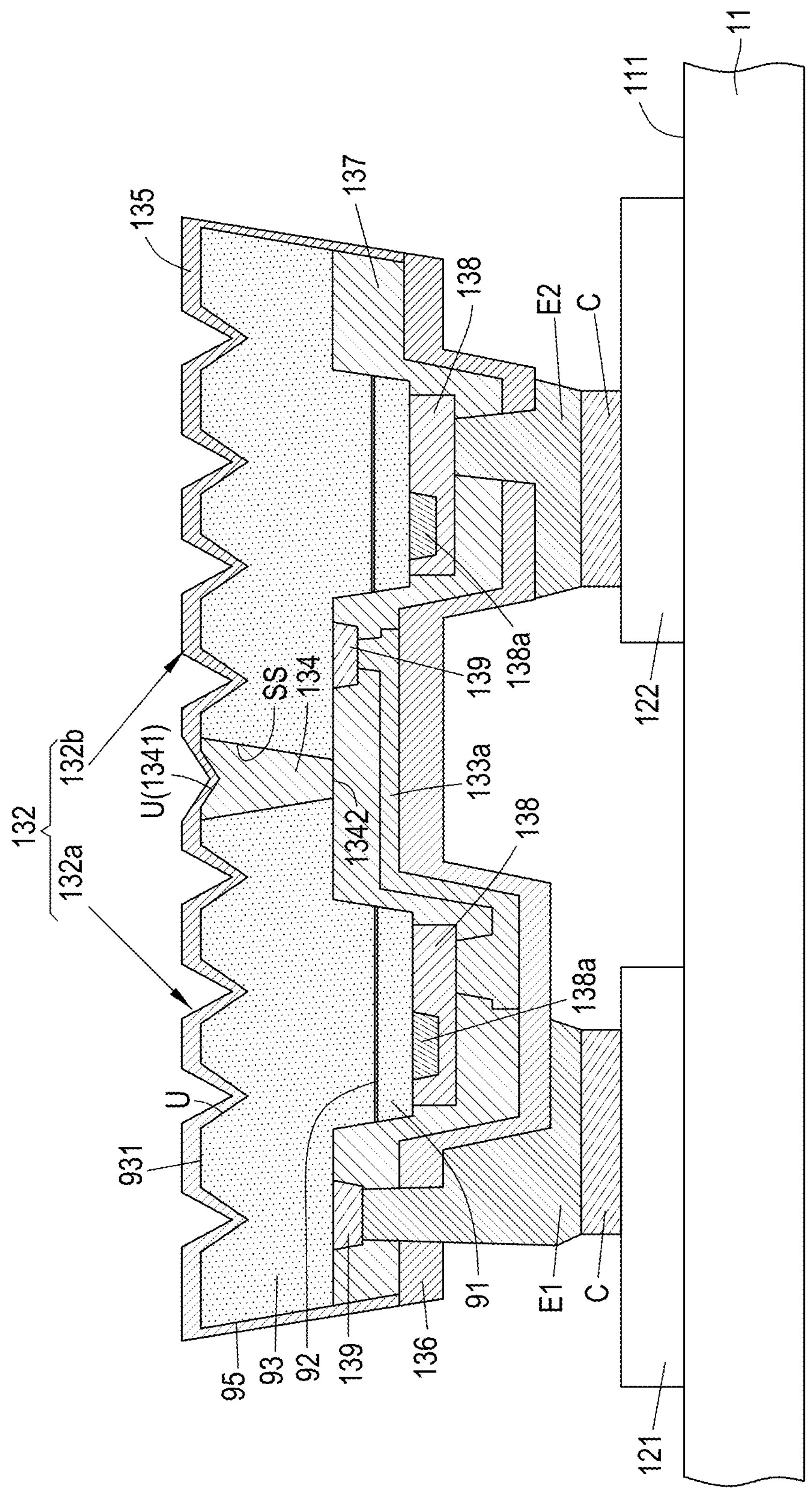
FIG. 1C is a sectional view of the micro LED display device of FIG. 1A along the line B-B.

FIG. 1A is a top view of a micro LED display device according to an embodiment of this disclosure, FIG. 1B is a sectional view of the micro LED display device of FIG. 1A along the line A-A, and FIG. 1C is a sectional view of the micro LED display device of FIG. 1A along the line B-B.

Referring to FIGS. 1A to 1C, the micro LED display device 1 of this embodiment includes a circuit substrate 11, a circuit pattern 12 and a plurality of sub-pixel units 13.

The circuit pattern 12 is disposed on the circuit substrate 11 and includes a plurality of first circuits 121 and a plurality of second circuits 122, and the electrical properties of the first circuits 121 are different from the electrical properties of the second circuits 122. In this embodiment, the first circuits 121 and the second circuits 122 are arranged alternately. That is, the surface 111 of the circuit substrate 11 is sequentially formed with one first circuit 121, one second circuit 122, one first circuit 121, one second circuit 122, one first circuit 121, . . . , and so on.

The sub-pixel units 13 are respectively arranged on the circuit pattern 12, and each of the sub-pixel units 13 is electrically connected to one of the first circuits 121 and one of the second circuits 122. In this embodiment, the sub-pixel units 13 are arranged in an array including multiple rows and multiple columns, and are electrically connected to the corresponding first circuits 121 and the corresponding second circuits 122. Accordingly, the circuit substrate 11 can respectively transmit electrical signals (e.g. driving voltages) to the corresponding sub-pixel units 13 through the first circuits 121 and the second circuits 122 of the circuit pattern 12, thereby driving each sub-pixel unit 13 to emit light. In one embodiment, the circuit pattern 12 includes a plurality of circuit pairs, and each circuit pair includes one first circuit 121 and one second circuit 122. The sub-pixel units 13 can be divided into multiple groups of sub-pixel units 13. Each circuit pair is configured corresponding to one group of sub-pixel units 13, so that one group of sub-pixel units 13 can be driven by one circuit pair, which includes one first circuit 121 and one second circuit 122.

In one embodiment, the circuit substrate 11 may be, for example, a CMOS (Complementary Metal-Oxide-Semiconductor) substrate, a LCOS (Liquid Crystal on Silicon) substrate, a TFT (Thin Film Transistor) substrate, or any of other driving substrates have working circuits to drive each sub-pixel unit 13 to emit light with a corresponding color. In some embodiments, the length of the circuit substrate 11 may be, for example but not limited to, less than or equal to 1 inch, and the PPI (pixels per inch) of the circuit substrate 11 may be greater than 1000. In other embodiments, the length of the circuit substrate 11 may be greater than 1 inch, and the PPI of the circuit substrate 11 is not limited.

In one embodiment, each sub-pixel unit 13 may include at least one light-emitting element (i.e., a micro LED), and may emit monochromatic or colored light. The colored light may include, for example, red light, green light, blue light, or yellow light, and the light color emitted by each sub-pixel unit 13 of this disclosure is not limited.

In the sub-pixel units 13, at least one sub-pixel unit 13 includes at least one first light-emitting element 131 and a second light-emitting element 132. In this embodiment, the micro LED display device 1, as shown in FIG. 1A, includes, for example, 6 sub-pixel units 13, wherein three sub-pixel units 13 include one first light-emitting element 131 and one second light-emitting element 132, and the other three sub-pixel units 13 include one first light-emitting element 131 (without the second light-emitting element 132).

As shown in FIG. 1B, the first light-emitting element 131 of this embodiment is, for example, a vertical-chip type micro LED, but this disclosure is not limited thereto. In different embodiments, the first light-emitting element 131 may be a flip-chip type micro LED. In this embodiment, the first light-emitting element 131 includes a first electrode E1 and a second electrode E2. The first electrode E1 is electrically connected to one (or corresponding one) of the first circuits 121, and the second electrode E2 is electrically connected to one (or corresponding one) of the second circuits 122. The projection of at least one of the first electrode E1 and the second electrode E2 on the circuit substrate 11 is away from the projection of the electrically connected first circuit 121 or the electrically connected second circuit 122 on the circuit substrate 11. In other words, the first electrode E1 and the second electrode E2 of the first light-emitting element 131 of this embodiment are located on opposite sides of the first light-emitting element 131, while the projection of the first electrode E1 of the first light-emitting element 131 on the circuit substrate 11 is overlapped with the correspondingly electrically connected first circuit 121, but the projection of the second electrode E2 of the first light-emitting element 131 on the circuit substrate 11 is away from the correspondingly electrically connected second circuit 122.

The first light-emitting element 131 further includes a first-type semiconductor layer 91, a light-emitting layer 92 and a second-type semiconductor layer 93 that are sequentially stacked from bottom to top. Specifically, the light-emitting layer 92 is sandwiched between the first-type semiconductor layer 91 and the second-type semiconductor layer 93, the first electrode E1 is connected to the first-type semiconductor layer 91, and the second electrode E2 is connected to the second-type semiconductor layer 93. In this embodiment, the light-emitting layer 92 may be, for example, an MQW (Multiple Quantum Well) layer, the first-type semiconductor layer 91 may be, for example, an N-type semiconductor, and the second-type semiconductor layer 93 may be, for example, a P-type semiconductor. To be noted, this disclosure is not limited thereto. In different embodiments, the first-type semiconductor layer 91 may be a P-type semiconductor, and the second-type semiconductor layer 93 may be an N-type semiconductor.

In order to drive the first light-emitting element 131 to emit light, in this embodiment, the first electrode E1 of the first light-emitting element 131 is electrically connected to the corresponding first circuit 121 through a bonding pad C. The material of the bonding pad C may include, for example but is not limited to, tin, copper, silver, gold, or an alloy of any combination of the above materials (e.g. copper and any above-mentioned metal other than tin). In addition, the micro LED display device 1 of this embodiment further includes a patterned conductive layer 133. The second electrode E2 of the first light-emitting element 131 is electrically connected to the corresponding second circuit 122 via the patterned conductive layer 133. Therefore, the driving voltage for driving the first light-emitting element 131 to emit light, which is provided by the circuit substrate 11, can be received through the first circuit 121, the first electrode E1, the second circuit 122, the patterned conductive layer 133 and the second electrode E2. In addition, the sub-pixel unit 13 of this embodiment may further include an insulating layer 130, which is disposed between the first circuit 121, the first light-emitting element 131 and the second circuit 122 to assist in forming the patterned conductive layer 133, so that the second electrode E2 can be electrically connected to the second circuit 122 through the patterned conductive layer 133.

The second light-emitting element 132 is electrically connected to one of the first circuits 121 and one of the second circuits 122, and is connected in parallel with the first light-emitting element 131. The projection of the second light-emitting element 132 on the circuit substrate 11 is overlapped with the projections of the electrically connected first circuit 121 and the electrically connected second circuit 122 on the circuit substrate 11. Specifically, the second light-emitting element 132 in this embodiment is a repair chip. When the first light-emitting element(s) 131 in one or more sub-pixel units 13 fail and do not emit light, the second light-emitting element(s) 132 can be functioned through the repair process so as to repair the failed sub-pixel unit(s) 13. Therefore, the present disclosure does not limit how many sub-pixel units 13 need to be provided with the second light-emitting element 132, which will be determined after actual testing.

In the same sub-pixel unit 13, the second light-emitting element 132 (repair chip) has the same light color as the first light-emitting element 131. That is, the emitted lights of the second light-emitting element 132 and the first light-emitting element 131 are within the same wavelength range of one light color. Preferably, the wavelength difference between the light colors of the second light-emitting element 132 and the first light-emitting element 131 is preferably less than 2 nm. Therefore, when the first light-emitting element 131 fails and does not emit light, it can be repaired by using the second light-emitting element 132 connected in parallel with the failed first light-emitting element 131 and emitting the same light color as the failed first light-emitting element 131, thereby achieving a better display effect.

As shown in FIG. 1C, in this embodiment, the projection of the second light-emitting element 132 on the circuit substrate 11 is overlapped with the projection of the electrically connected first circuit 121 and the electrically connected second circuit 122 on the circuit substrate 11. In this case, the second light-emitting element 132 is a flip-chip type micro LED and includes a first electrode E1 and a second electrode E2, which opposite electrical properties. The first electrode E1 and the second electrode E2 are located on the same side of the second light-emitting element 132 facing the circuit substrate 11. The first electrode E1 is connected to the corresponding first circuit 121 through the bonding pad C, and the first electrode E1 and the first circuit 121 are overlapped with each other. The second electrode E2 is connected to the corresponding second circuit 122 through another bonding pad C, and the second electrode E2 is overlapped with the second circuit 122. To be noted, the present disclosure does not limit to the case that the first electrode E1 and the second electrode E2 are completely overlapped with the corresponding first circuit 121 and the corresponding second circuit 122 respectively. In practice, this disclosure can work as long as the projection of the second light-emitting element 132 on the circuit substrate 11 is overlapped with the first circuit 121 and the second circuit 122 and completes the electrical connection In addition, the second light-emitting element 132 further includes two light-emitting regions **132*a* and 132*b*. The projections of the light-emitting regions 132*a* and 132*b* on the circuit substrate 11 are overlapped with the projections of the electrically connected first circuit 121 and the electrically connected second circuit 122 on the circuit substrate 11 respectively. Each of the light-emitting regions 132*a* and 132*b* respectively includes a first-type semiconductor layer 91, a light-emitting layer 92 and a second-type semiconductor layer 93, which are sequentially stacked from bottom to top. The light-emitting layer 92 is sandwiched between the first-type semiconductor layer 91 and the second-type semiconductor layer 93, the first electrode E1 is connected to the second-type semiconductor layer 93 of the light-emitting region 132*a*, and the second electrode E2 is connected to the first-type semiconductor layer 91 of the light-emitting region 132*b*. In addition, the second light-emitting element 132 further includes a conductive layer 133*a*, and the conductive layer 133*a* electrically connects the two light-emitting regions 132*a* and 132*b* in a tandem structure. In this case, both ends of the conductive layer 133*a* are electrically connected to the first-type semiconductor layer 91 of the light-emitting region 132*a* and the second-type semiconductor layer 93 of the light-emitting region 132*b* respectively, so that the two light-emitting regions 132*a* and 132*b* are connected in a tandem structure. In one embodiment, the light-emitting element 132** can be, for example but not limited to, a tandem MicroLED.

Specifically, one end of the conductive layer 133*a* is electrically connected to the first-type semiconductor layer 91 of the light-emitting region 132*a* through an ohmic contact layer 138, and the other end of the conductive layer 133*a* is electrically connected to the second-type semiconductor layer 93 of the light-emitting region 132*b* through another ohmic contact layer 139. Therefore, the circuit substrate 11 can drive the second light-emitting element 132 (including the light-emitting regions 132*a* and 132*b*) to emit light through the first circuit 121, the first electrode E1, the second circuit 122 and the second electrode E2. It should be noted that the second light-emitting element 132 of this embodiment further includes another ohmic contact layer 138*a* disposed inside the ohmic contact layer 138. Optionally, the ohmic contact layer 138*a* and the ohmic contact layer 139 may serve as the current spreading layers. In different embodiments, the second light-emitting element 132 can be configured without the ohmic contact layer 138*a* and the ohmic contact layer 139.

The above-mentioned patterned conductive layer 133 or the conductive layer 133*a* may include metal, transparent conductive material, or a combination thereof, and this disclosure is not limited thereto. In this embodiment, the metal material may include, for example, aluminum, copper, silver, molybdenum, or titanium, or any alloys thereof, and the transparent conductive material may include, for example, indium tin oxide (ITO), indium zinc oxide (IZO), aluminum zinc oxide (AZO), cadmium tin oxide (CTO), tin oxide ($SnO_2$), zinc oxide (ZnO), or any of other transparent conductive materials, and this disclosure is not limited thereto.

In addition, the second light-emitting element 132 of this embodiment further includes an insulating structure 134, and a separation space SS is defined between the light-emitting regions 132*a* and 132*b*. The insulating structure 134 is arranged in the separation space SS between the light-emitting regions 132*a* and 132*b*. In this embodiment, the insulating structure 134, for example, fills the entire separation space SS between the two light-emitting regions 132*a* and 132*b*, thereby increasing the structural strength of the second light-emitting element 132, thereby improving the production yield especially when transferring the second light-emitting element 132 to the circuit substrate 11. The width of the aforementioned separation space SS is less than the width of any one of the light-emitting regions 132*a* and 132*b*. This configuration can avoid insufficient structural strength of the second light-emitting element 132. In one embodiment, the width of any one of the light-emitting regions 132*a* and 132*b* in the second light-emitting element 132 can be greater than 3 times or more of the width of the separation space SS. In the insulating structure 134 of this embodiment, the ratio of the width of the top surface 1341 to the width of the bottom surface 1342 may be greater than or equal to 1.5 and less than or equal to 3. It should be noted that the "width" in this disclosure is defined in one direction parallel to the surface 111 of the circuit substrate 11.

In one embodiment, the insulating structure 134 may include an inorganic material, such as, for example but not limited to, silicon dioxide. In some embodiments, the insulating structure 134 may include an organic material, such as, for example but not limited to, an organic photoresist. In some embodiments, the surface of the insulating structure 134 (i.e., the surface contacts the light-emitting regions 132*a* and 132*b*) can be provided with a reflective material to form a light reflective surface, thereby improving the light outputting efficiency of the light-emitting regions 132*a* and 132*b*. In addition, the top surface 1341 of the insulating structure 134 and the light outputting surface 931 of the entire second light-emitting element 132 may have a continuously distributed concave structure U, which is configured as a roughened structure to assist light outputting, so that the subsequent film or layer (e.g. a protection layer 135) can be formed thereon with a better production yield. In addition, the width of the insulating structure 134 gradually increases in a direction away from the circuit substrate 11. In other words, the width of the insulating structure 134 is gradually narrower as it is closer to the circuit substrate 11. To be noted, this disclosure is not limited thereto.

In this embodiment, the second light-emitting element 132 further includes a protection layer 135. The protection layer 135 is conformally disposed on the top surface 1341 of the insulating structure 134 and covers the light outputting surfaces 931 of the light-emitting regions 132*a* and 132*b*. The protection layer 135 connects the two adjacent light-emitting regions 132*a* and 132*b*, so that the structural strength of the second light-emitting element 132 can be improved. The protection layer 135 may further extend to cover the side walls 95 of the light-emitting regions 132*a* and 132*b*.

In addition, the second light-emitting element 132 further includes an insulating layer 136 disposed between the circuit substrate 11 and the conductive layer 133*a*. In this embodiment, the insulating layer 136 is disposed on the lower surface of the second light-emitting element 132 and connected to the protection layer 135. The insulating layer 136 is provided with a through hole, so that the first electrode E1 and the second electrode E2 can pass through the through hole, so that the light-emitting regions 132*a* and 132*b* can be electrically connected to the circuit substrate 11 respectively. In one embodiment, the insulating layer 136 and the protection layer 135 may be made of the same material. The insulating layer 136 or the protection layer 135 can be made of an organic material (e.g. structural photoresist) or inorganic material (e.g. silicon dioxide or silicon nitride), and this disclosure is not limited thereto.

In addition, the light-emitting regions 132*a* and 132*b* further include a light reflective layer 137, which is disposed between the light-emitting regions 132*a* and 132*b* and the conductive layer 133*a*. In this embodiment, the light reflective layer 137 is further disposed between the light-emitting regions 132*a* and 132*b* and the insulating layer 136. In this case, the light reflective layer 137 includes a material with high reflectivity. Due to the configuration of the light reflective layer 137, the light emitted by the light-emitting regions 132*a* and 132*b* toward the circuit substrate 11 can be reflected upwardly and outputted in the direction toward the light outputting surface 931, thereby improving the light outputting efficiency. The light reflective layer 137 of this embodiment is provided with through holes through, and the conductive layer 133*a*, the first electrode E1 and the second electrode E2 can pass through the through hole, so that the light-emitting regions 132*a* and 132*b* can be connected in a tandem structure with each other internally and electrically connected with the circuit substrate 11 respectively.

With reference to FIGS. 1B and 1C, in this embodiment, the total area of the light-emitting layers 92 of the light-emitting regions 132*a* and 132*b* is greater than the area of the light-emitting layer 92 of the first light-emitting element 131. In one embodiment, the total area of the light-emitting layers 92 of the light-emitting regions 132*a* and 132*b* is, for example, twice the area of the light-emitting layer 92 of the first light-emitting element 131. Therefore, even if the number of the first light-emitting elements 131 is two, when one of the first light-emitting elements 131 is damaged and causes the two first light-emitting elements 131 to fail, the second light-emitting element 132 can be coupled to the circuit substrate 11. In this way, the lighting area equivalent to multiple first light-emitting elements 131 can be replaced through the repair process for a single light-emitting chip.

As mentioned above, in the micro LED display device 1 of this embodiment, the sub-pixel unit 13 includes a first light-emitting element 131 and a second light-emitting element 132. The projection of at least one of the first electrode E1 and the second electrode E2 of the first light-emitting element 131 on the circuit substrate 11 is away from the projection of the electrically connected first circuit 121 or the electrically connected second circuit 122 on the circuit substrate 11. The second light-emitting element 132 is electrically connected to the first circuit 121 and the second circuit 122 and is connected in parallel with the first light-emitting element 131. The projection of the second light-emitting element 132 on the circuit substrate 11 is overlapped with the projection of the electrically connected first circuit 121 and the electrically connected second circuit 122 on the circuit substrate 11. Based on this structural design, when the first light-emitting element 131 in the sub-pixel unit 13 of this embodiment is failed and the second light-emitting element 132 is used to repair the failed first light-emitting element 131, it is unnecessary to manufacture the additional conductive circuits for connecting electrodes by photolithography process. Accordingly, this embodiment can simultaneously solve the problems of reduced production yield of flip-chip processes under high resolution design and increased manufacturing time and cost for vertical chip repairing.

Figure 2A:
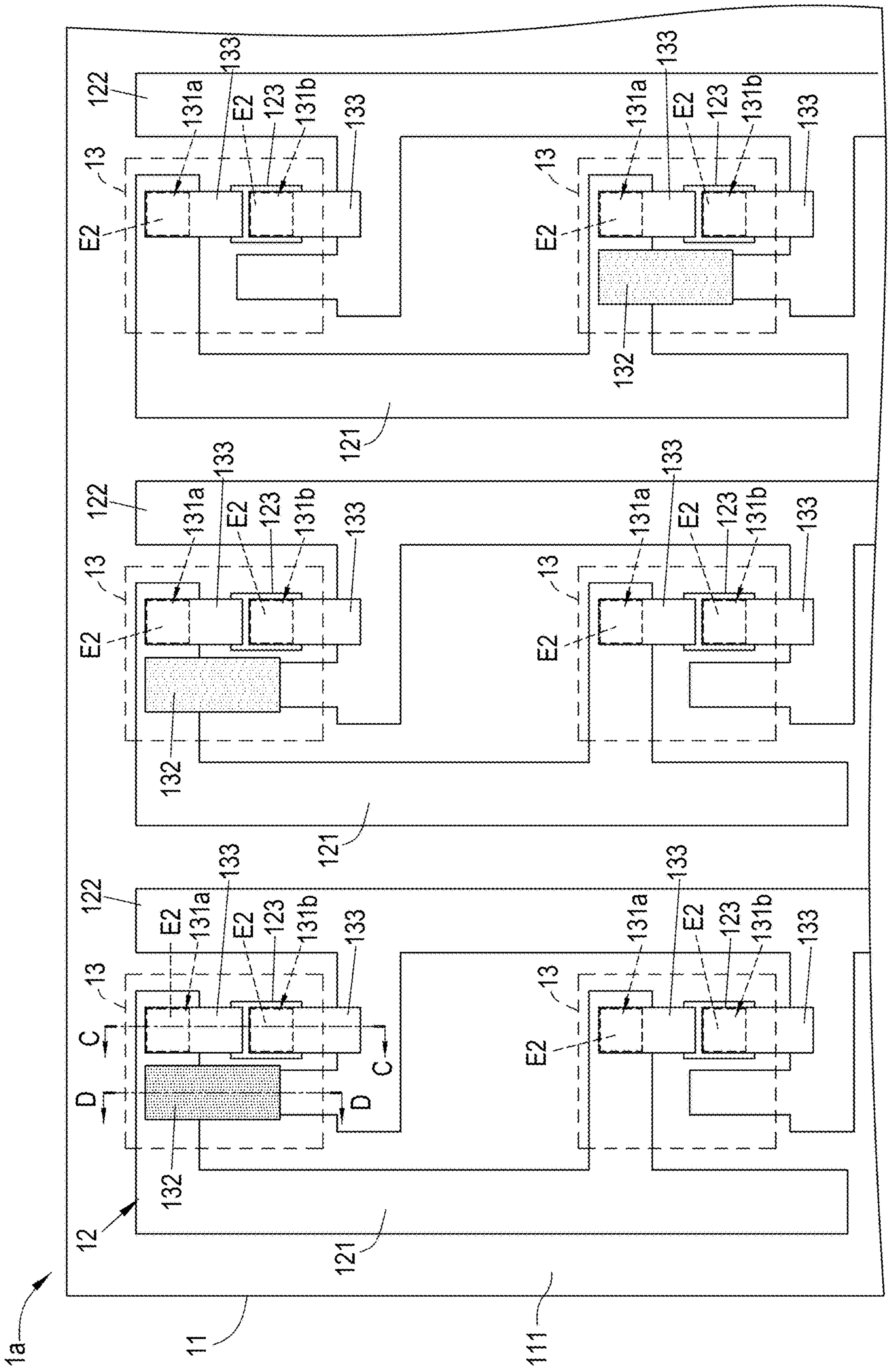
FIG. 2A is a top view of a micro LED display device according to another embodiment of this disclosure.
Figure 2B:
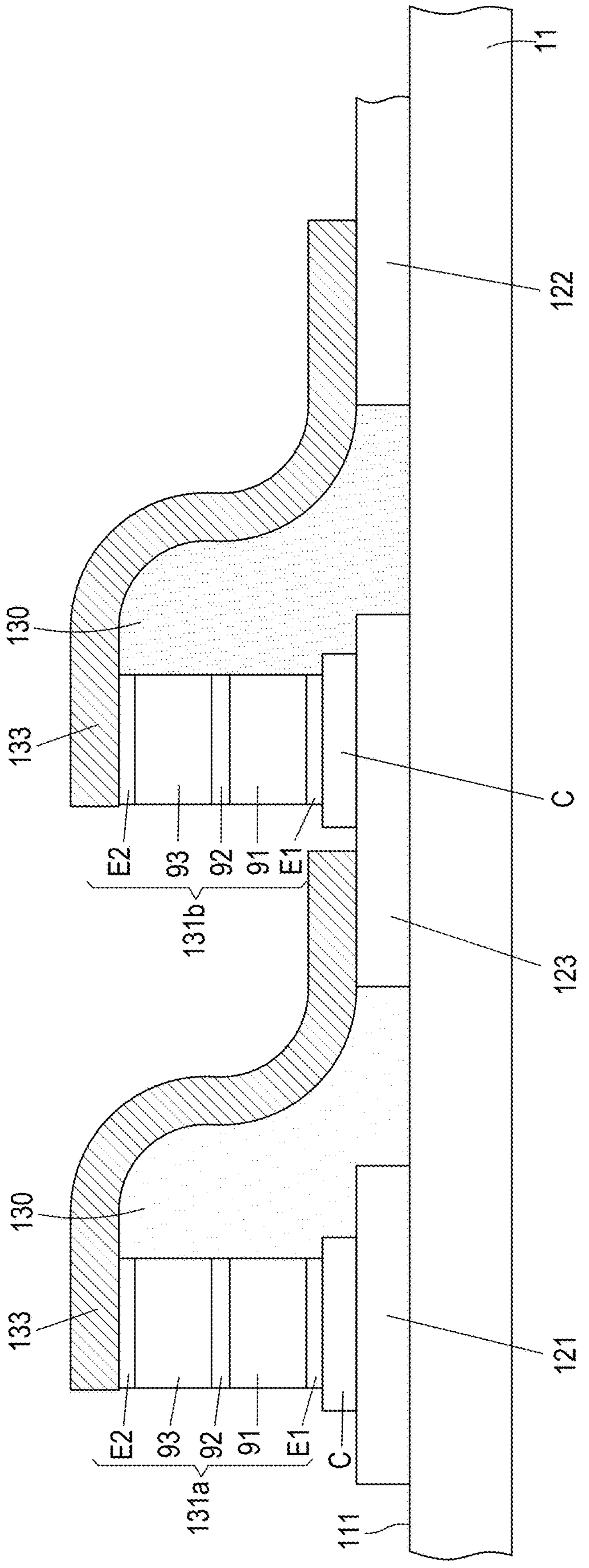
FIG. 2B is a sectional view of the micro LED display device of FIG. 2A along the line C-C.
Figure 2C:
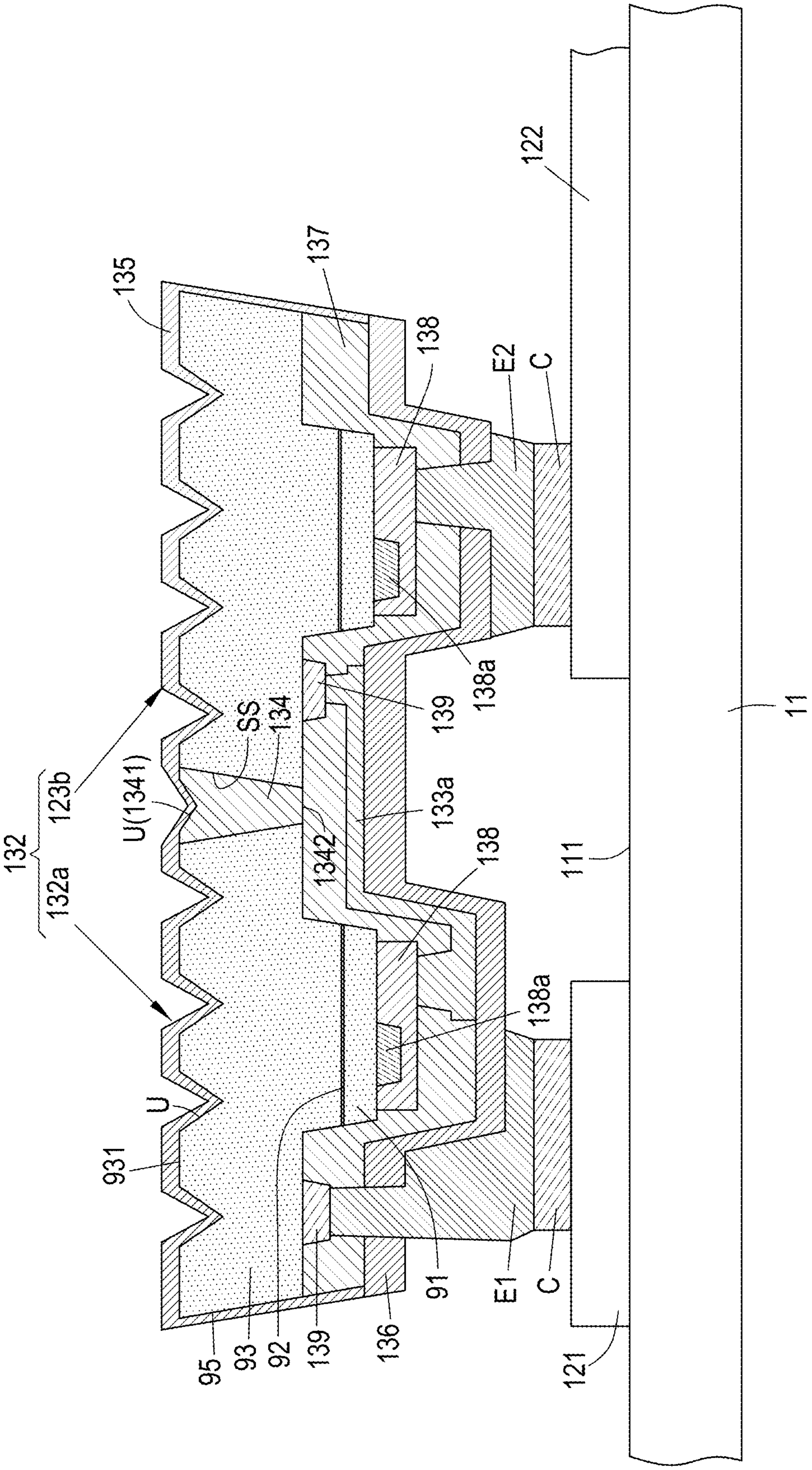
FIG. 2C is a sectional view of the micro LED display device of FIG. 2A along the line D-D.

FIG. 2A is a top view of a micro LED display device according to another embodiment of this disclosure, FIG. 2B is a sectional view of the micro LED display device of FIG. 2A along the line C-C, and FIG. 2C is a sectional view of the micro LED display device of FIG. 2A along the line D-D.

Referring to FIGS. 2A and 2B, the component configuration and connections of the micro LED display device 1*a* of this embodiment are mostly the same as those of the micro LED display device 1 of the previous embodiment. Unlike the micro LED display device 1, the circuit pattern 12 of the micro LED display device 1*a* of this embodiment further includes a connection pad 123, which is separated from the first circuits 121 and the second circuits 122. In this embodiment, the circuit pattern 12 includes a plurality of connection pads 123, and each connection pad 123 is located between the corresponding first circuit 121 and the corresponding second circuit 122. In particular, each connection pad 123 is separated from the corresponding first circuit 121 and the corresponding second circuit 122, so that each connection pad 123 is electrically insulated from the corresponding first circuit 121 and the corresponding second circuit 122.

In addition, each sub-pixel unit 13 includes two first light-emitting elements, including a first light-emitting element 131*a* and a first light-emitting element 131*b*. The first light-emitting element 131*a* and the first light-emitting element 131*b* are electrically connected to each other. In this embodiment, the first electrode E1 of the first light-emitting element 131*a* is coupled to the corresponding first circuit 121 through a bonding pad C, and the first electrode E1 of the first light-emitting element 131*b* is coupled to the connection pad 123 through a bonding pad C. In addition, the patterned conductive layer 133 is connected in series to the second electrode E2 of the first light-emitting element 131*a* and the connection pad 123, and the patterned conductive layer 133 is also connected in series to the second electrode E2 of the first light-emitting element 131*b* and the corresponding second circuit 122. In this case, the patterned conductive layer 133 is a discontinuous structure, which covers the two second electrodes E2 of the two first light-emitting elements 131*a* and 131*b* respectively, and extends to cover the connection pads 123 and the second circuits 122 respectively. In this embodiment, the projection of the first electrode E1 and the second electrode E2 of the first light-emitting element 131*a* on the circuit substrate 11 is overlapped with the corresponding first circuits 121 but is away from the corresponding second circuits 122, and the projection of the first electrode E1 and the second electrode E2 of the first light-emitting element 131*b* on the circuit substrate 11 is overlapped with the connection pad 123 but is away from the corresponding second circuits 122 (and the first circuits 121). In addition, the insulating layer 130 of this embodiment is disposed between the first circuit 121, the first light-emitting element 131*a* and the connection pad 123, and the insulating layer 130 is also disposed between the connection pad 123, the first light-emitting element 131*b* and the second circuit 122 to assist in the formation of the patterned conductive layer 133.

Figure 2D:
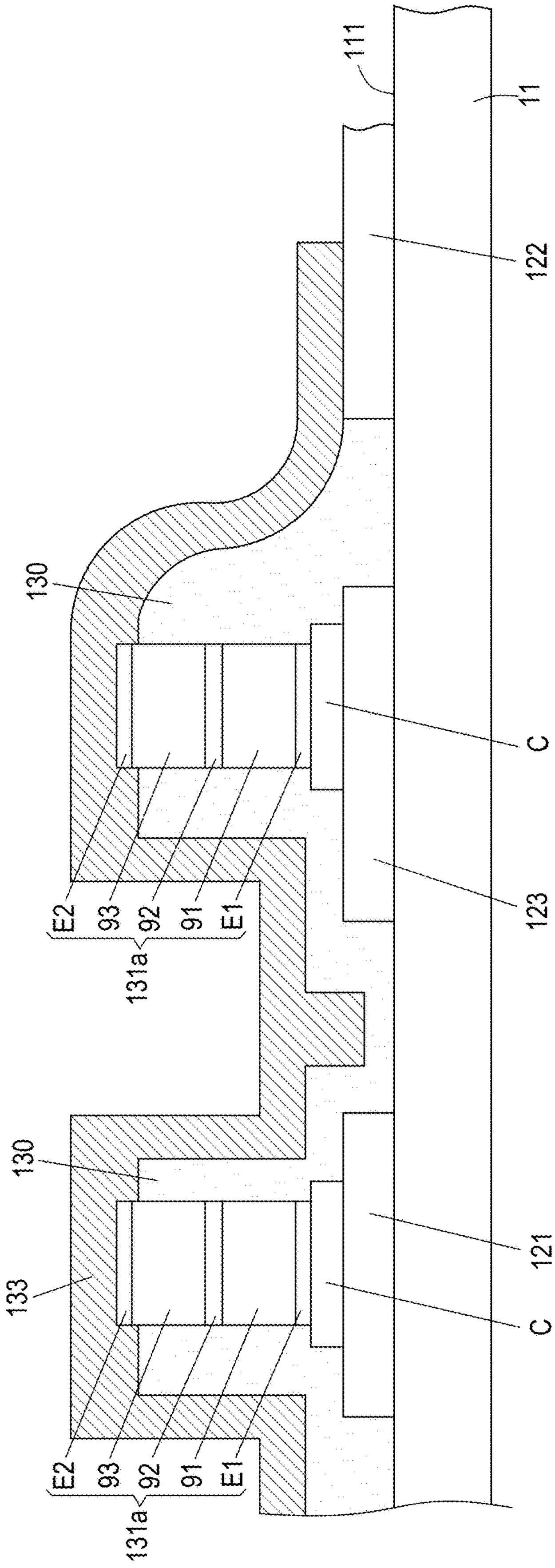
FIG. 2D is a sectional view of another aspect of the micro LED display device of FIG. 2A along the line C-C.

In another aspect of the first light-emitting elements 131*a* and 131*b*, as shown in FIG. 2D, the first electrode E1 of the first light-emitting element 131*a* is coupled to the corresponding first circuit 121 through the bonding pad C, and the first electrode E1 of the first light-emitting element 131*b* is coupled to the connection pad 123 through the bonding pad C. In addition, the patterned conductive layer 133 is electrically insulated from the connection pad 123, and is connected in series to the second electrode E2 of the first light-emitting element 131*a*, the second electrode E2 of the first light-emitting element 131*b*, and the second circuit 122. In this case, the patterned conductive layer 133 has a continuous structure and covers the two second electrodes E2 of the two first light-emitting elements 131*a* and 131*b*.

Unlike the embodiment as shown in FIG. 1C, in the micro LED display device 1*a* of this embodiment as shown in FIG. 2C, the second circuits 122 have wider width. That is, the second circuit 122 for connecting the second electrode E2 of the second light-emitting element 132 has a corresponding change in pattern according to the change in the number or size of the first light-emitting elements 131*a* and 131*b*. The other structures of the micro LED display device 1*a* as shown in FIG. 2C are the same as those shown in FIG. 1C, so the detailed descriptions thereof will be omitted.

In one embodiment, the interval between the first light-emitting elements 131*a* and 131*b* may be greater than the interval between the light-emitting regions 132*a* and 132*b*, or the total width of the first light-emitting elements 131*a* and 131*b* may be greater than the total width of the second light-emitting element 132 (including the light-emitting regions 132*a* and 132*b*). In other words, when the total lighting area of the light-emitting layers 92 of the second light-emitting element 132 is the same as or similar to the total lighting area of the light-emitting layers 92 of the first light-emitting elements 131, the conductive layer 133*a*, which is configured to connect the light-emitting regions 132*a* and 132*b* of the second light-emitting element 132 in a tandem structure, has an area occupied on the circuit substrate 11 being smaller than the total area of the first light-emitting elements 131*a* and 131*b* and the patterned conductive layer 133 used to connect the first light-emitting elements 131*a* and 131*b* in a tandem structure. In this case, the second light-emitting element 132 not only uses the tandem structure to repair two light-emitting regions simultaneously so as to reduce the number of repairing processes, but also reduces the risk of affecting surrounding circuits or normal chips due to size factors during the manufacturing process so as to increase the production yield.

Figure 3A:
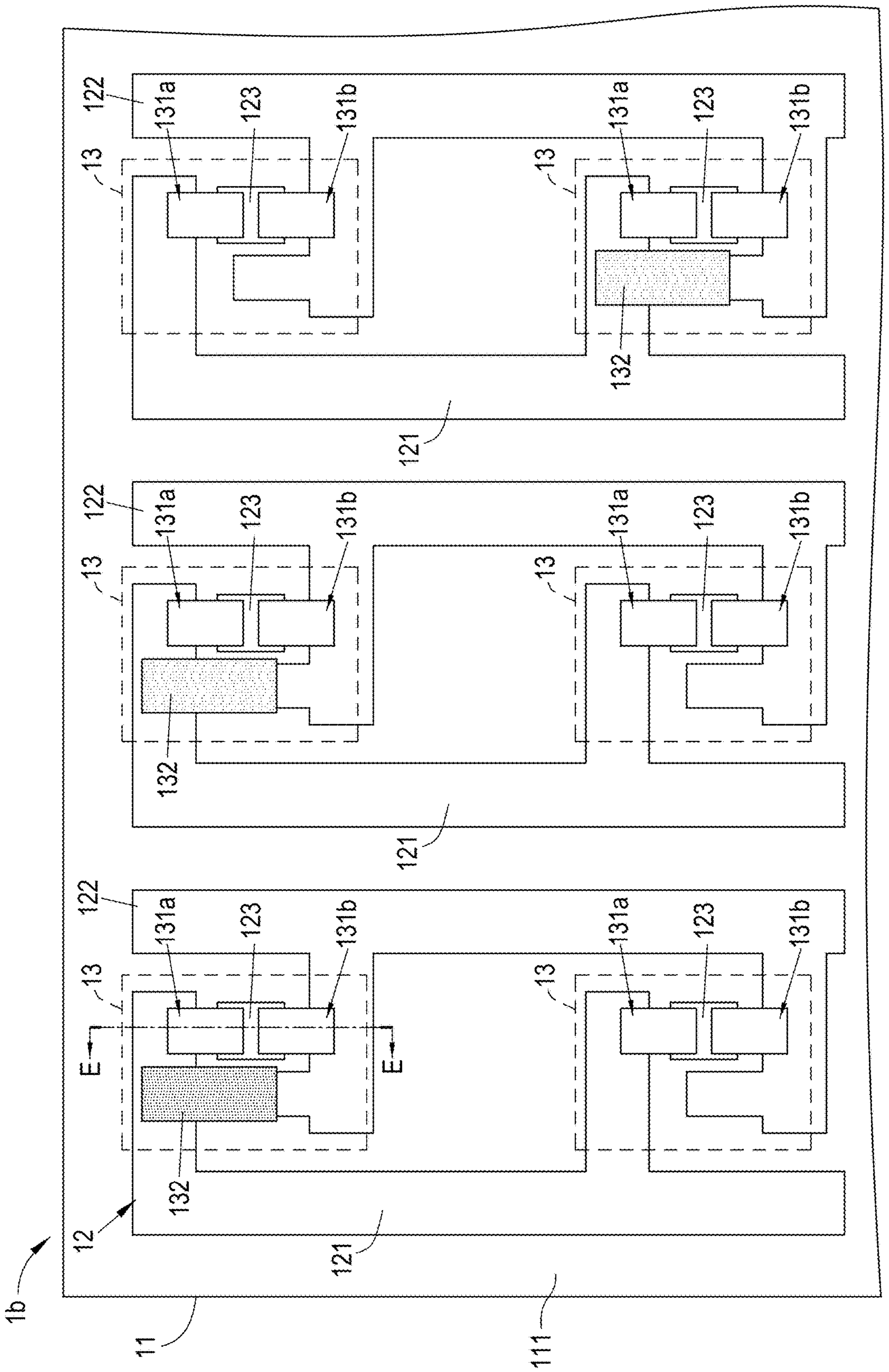
FIG. 3A is a top view of a micro LED display device according to another embodiment of this disclosure.
Figure 3B:
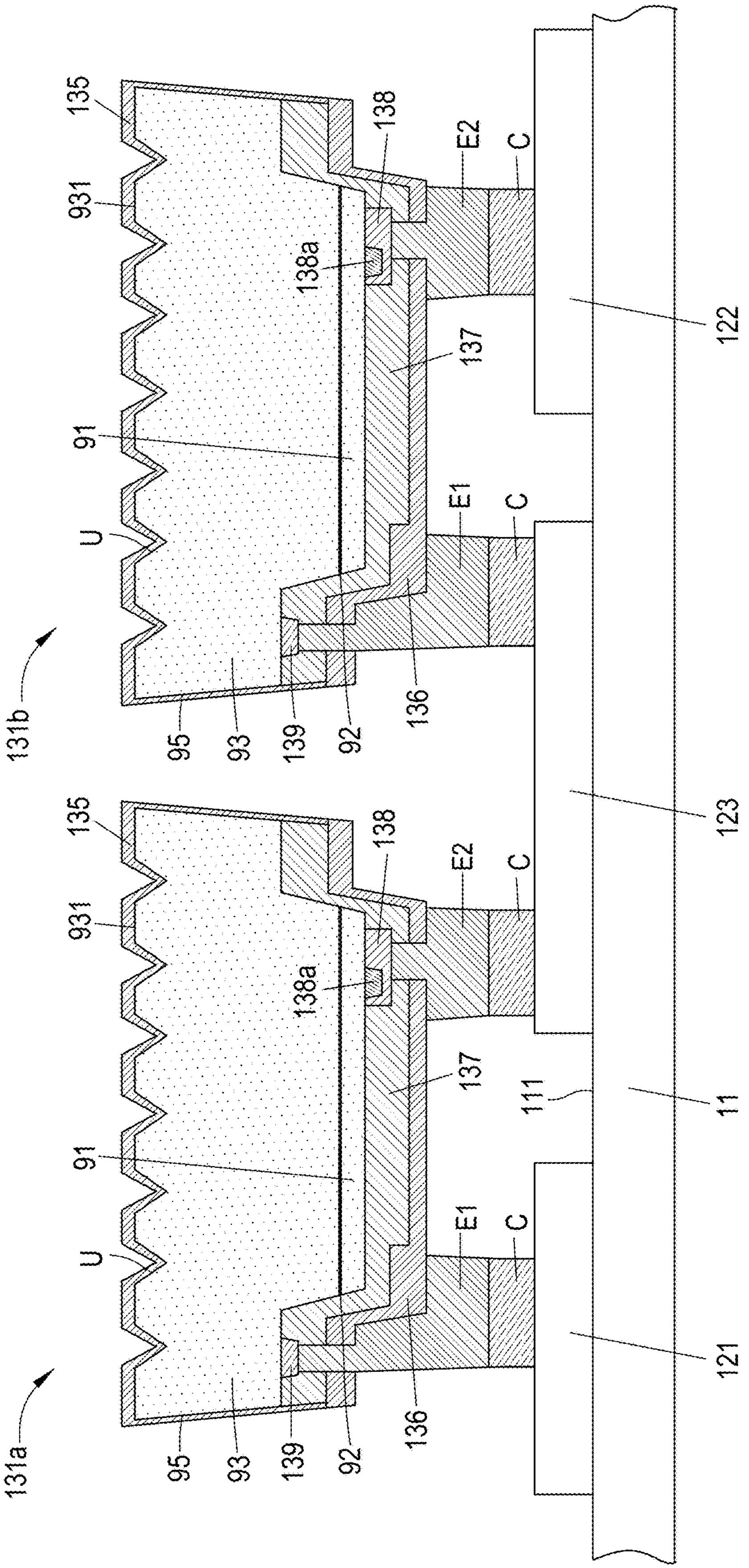
FIG. 3B is a sectional view of the micro LED display device of FIG. 3A along the line E-E.

FIG. 3A is a top view of a micro LED display device according to another embodiment of this disclosure, and FIG. 3B is a sectional view of the micro LED display device of FIG. 3A along the line E-E. To be noted, the structure of the second light-emitting element 132 of this embodiment is the same as that shown in FIG. 2C, it is not shown in FIGS. 3A and 3B.

Referring to FIGS. 3A and 3B, the component configuration and connections of the micro LED display device 1*b* of this embodiment are mostly the same as those of the micro LED display device 1*a* of the previous embodiment. Unlike the micro LED display device 1*a*, in the micro LED display device 1*b*, the first light-emitting elements 131*a* and 131*b* are both flip-chip type micro LED chips, so the first electrode E1 and the second electrode E2 of the first light-emitting element 131*a* or 131*b* are located at the same side of the first light-emitting element 131*a* or 131*b*. In addition, the first electrode E1 of the first light-emitting element 131*a* is coupled to the corresponding first circuit 121 through the bonding pad C, the second electrode E2 of the first light-emitting element 131*b* is coupled to the second circuit 122 through the bonding pad C, and the second electrode E2 of the first light-emitting element 131*a* and the first electrode E1 of the first light-emitting element 131*b* are respectively coupled to one single connection pad 123 through another bonding pad C. In addition, in this embodiment, the projection of the first electrode E1 of the first light-emitting element 131*a* on the circuit substrate 11 is overlapped with the corresponding electrically connected first circuit 121, but the projection of the second electrode E2 thereof on the circuit substrate 11 is away from the first circuit 121 and the corresponding electrically connected second circuit 122. In contrast, the projection of the first electrode E1 of the first light-emitting element 131*b* on the circuit substrate 11 is away from the corresponding electrically connected first circuit 121, but the projection of the second electrode E2 thereof on the circuit substrate 11 is overlapped with the corresponding second circuit 122. That is, each of the first light-emitting elements 131*a* and 131*b* of this embodiment each has an electrode having a projection on the circuit substrate 11 that is away from the circuit with corresponding electrical property.

Figure 4:
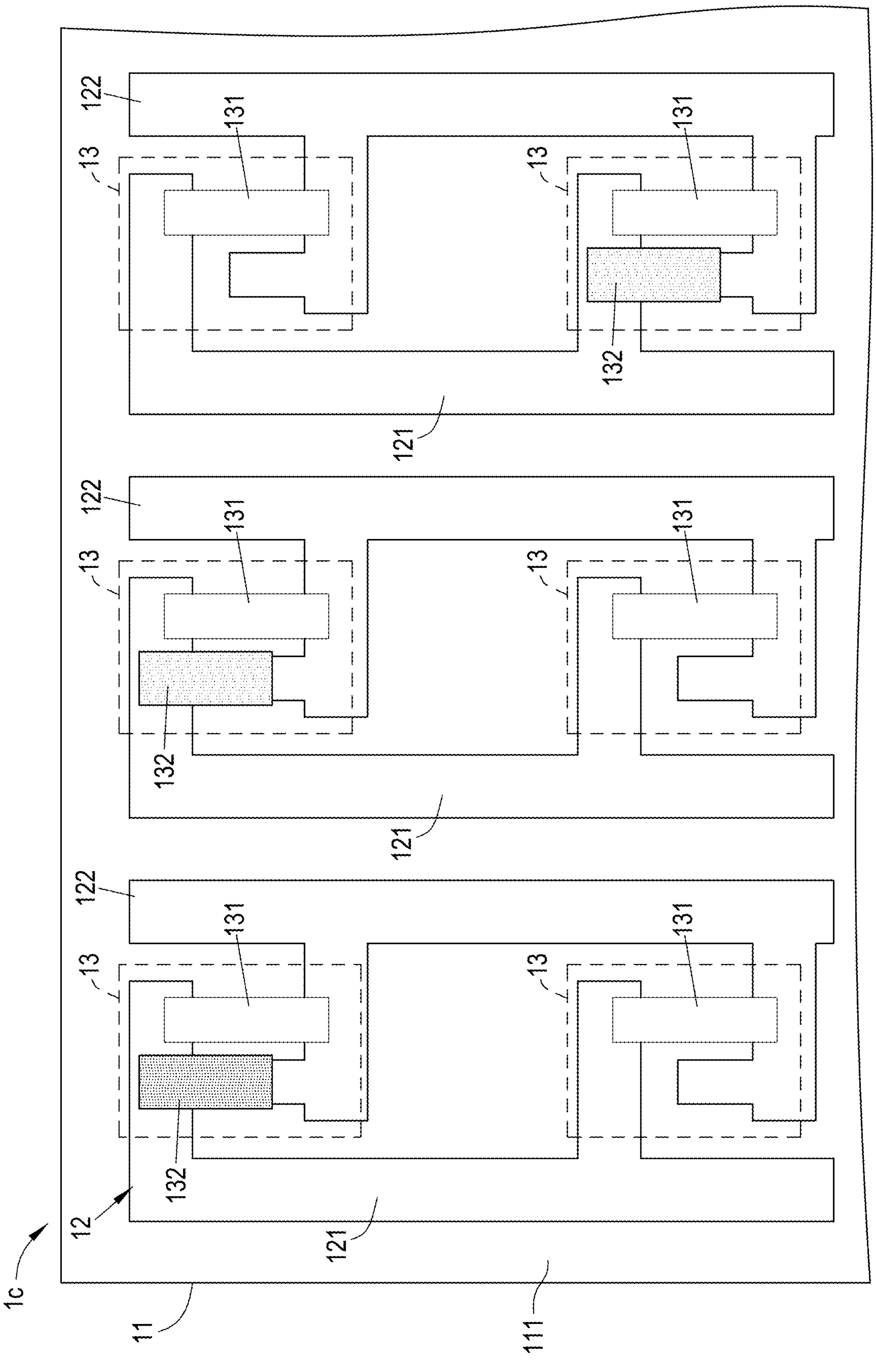
FIG. 4 is a top view of a micro LED display device according to another embodiment of this disclosure.

FIG. 4 is a top view of a micro LED display device according to another embodiment of this disclosure.

Referring to FIG. 4, the component configuration and connections of the micro LED display device 1*c* of this embodiment are mostly the same as those of the micro LED display device 1 or 1*a* of the previous embodiments. Similar to the previous embodiments, the micro LED display device 1*c* of this embodiment also includes a circuit substrate 11, a circuit pattern 12 and a plurality of sub-pixel units 13. The circuit pattern 12 is disposed on the circuit substrate 11 and includes a plurality of first circuits 121 and a plurality of second circuits 122, wherein the electrical properties of the first circuits 121 are different from the electrical properties of the second circuits 122. The sub-pixel units 13 are respectively arranged on the circuit pattern 12, and at least one of the sub-pixel units 13 includes a first light-emitting element 131 and a second light-emitting element 132. In this embodiment, as shown in FIG. 4, the micro LED display device 1*c* includes, for example, six sub-pixel units 13, wherein three of the six sub-pixel units 13 each include a first light-emitting element 131 and a second light-emitting element 132, and the other three of the six sub-pixel units 13 each include a first light-emitting element 131 (without the second light-emitting element 132).

Unlike the micro LED display device 1 or 1*a* of the previous embodiments, the first light-emitting element 131 of the micro LED display device 1*c* of this embodiment is electrically connected to one (or a corresponding one) of the first circuits 121 and one (or a corresponding one) of the second circuits 122. The first light-emitting element 131 includes two sub first light-emitting elements, and the projections of the sub first light-emitting elements on the circuit substrate 11 are overlapped with the projections of the electrically connected first circuit 121 and the electrically connected second circuit 122 on the circuit substrate 11, respectively. The luminous color of the second light-emitting element 132 is the same as the luminous color of the first light-emitting element 131. The second light-emitting element 132 is electrically connected to one (or a corresponding one) of the first circuits 121 and one (or a corresponding one) of the second circuits 122, so that the second light-emitting element 132 is connected in parallel with the first light-emitting element 131. In this embodiment, the second light-emitting element 132 includes two sub second light-emitting elements, and the projections of the sub second light-emitting elements on the circuit substrate 11 are overlapped with the projections of the electrically connected first circuit 121 and the electrically connected second circuit 122 on the circuit substrate 11, respectively.

Specifically, in this embodiment, each of the first light-emitting elements 131 and the second light-emitting elements 132 is a flip-chip type Micro LED element, and includes two light-emitting regions. To be noted, the structures of the two sub first light-emitting elements of each first light-emitting element 131 and the two sub second light-emitting elements of each second light-emitting element 132 can be referred to the descriptions of the embodiments as shown in FIG. 1C or 2C, so the detailed descriptions thereof will be omitted.

In addition, in the micro LED display device 1*c* of this embodiment, each of the sub first light-emitting elements and the sub second light-emitting elements includes a light-emitting layer, and a total area of the light-emitting layers of the sub second light-emitting elements is greater than or equal to a total area of the light-emitting layers of the sub first light-emitting elements. Accordingly, when the sub first light-emitting elements in one or more of the first light-emitting elements 131 fail and do not emit light, the second light-emitting element(s) 132, which has larger light-emitting area, can be functioned through the repair process, thereby obtaining a larger repair area.

In summary, in the micro LED display device of this disclosure, the projection of at least one of the first electrode and the second electrode of the first light-emitting element of the sub-pixel unit on the circuit substrate is away from the projection of the electrically connected first or second circuit on the circuit substrate, but the projection of the second light-emitting element on the circuit substrate is overlapped with the projection of the electrically connected first and second circuits on the circuit substrate. Based on this structural design, when the first light-emitting element in the sub-pixel unit of the micro LED display device is failed and the second light-emitting element is used to repair the failed first light-emitting element, it is unnecessary to manufacture the additional conductive circuits for connecting electrodes by photolithography process. Accordingly, this disclosure can simultaneously solve the problems of reduced production yield of flip-chip processes under high resolution design and increased manufacturing time and cost for vertical chip repairing.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A micro light-emitting diode (LED) display device, comprising:

a circuit substrate;

a circuit pattern disposed on the circuit substrate and comprising a plurality of first circuits and a plurality of second circuits, wherein electrical properties of the first circuits are different from electrical properties of the second circuits; and a plurality of sub-pixel units respectively arranged on the circuit pattern, wherein at least one of the sub-pixel units comprises:

at least one first light-emitting element comprising a first electrode and a second electrode, wherein the first electrode is electrically connected to one of the first circuits, the second electrode is electrically connected to one of the second circuits, a projection of at least one of the first electrode and the second electrode on the circuit substrate is away from a projection of the electrically connected first circuit or the electrically connected second circuit on the circuit substrate; and a second light-emitting element, wherein a luminous color of the second light-emitting element is same as a luminous color of the first light-emitting element, the second light-emitting element is electrically connected to one of the first circuits and one of the second circuits and is connected in parallel with the first light-emitting element, and a projection of the second light-emitting element on the circuit substrate is overlapped with a projection of the electrically connected first circuit and the electrically connected second circuit on the circuit substrate.

2. The micro LED display device of claim 1, further comprising:

a patterned conductive layer, wherein the first electrode and the second electrode are located at opposite sides of the at least one first light-emitting element, and the second electrode is electrically connected to one of the second circuits via the patterned conductive layer.

3. The micro LED display device of claim 2, wherein the circuit pattern further comprises a connection pad separated from the first circuits and the second circuits, the micro LED display device comprises two of the first light-emitting elements, the first electrode of one of the first light-emitting elements is coupled to one of the first circuits, and the first electrode of the other one of the first light-emitting elements is coupled to the connection pad.

4. The micro LED display device of claim 3, wherein the patterned conductive layer connects the conductive pad to the second electrode of one of the first light-emitting elements in series, and connects the second electrode of the other one of the first light-emitting elements to one of the second circuits.

5. The micro LED display device of claim 3, wherein the patterned conductive layer is electrically insulated from the conductive pad, and the second electrode of one of the first light-emitting elements is electrically connected to the second electrode of the other one of the first light-emitting elements via the patterned conductive layer.

6. The micro LED display device of claim 1, wherein the first electrode and the second electrode are located at one side of the at least one light-emitting element.

7. The micro LED display device of claim 6, wherein the circuit pattern further comprises a connection pad separated from the first circuits and the second circuits, the micro LED display device comprises two of the first light-emitting elements, the first electrode of one of the first light-emitting elements is coupled to one of the first circuits, and the second electrode of the other one of the first light-emitting elements is coupled to one of the second circuits.

8. The micro LED display device of claim 7, wherein the second electrode of one of the first light-emitting elements and the first electrode of the other one of the first light-emitting elements are coupled to the connection pad in series.

9. The micro LED display device of claim 1, wherein the second light-emitting element comprises two light-emitting regions, and projections of the light-emitting regions on the circuit substrate are overlapped with projections of the electrically connected first circuit and the electrically connected second circuit on the circuit substrate, respectively.

10. The micro LED display device of claim 9, wherein each of the first light-emitting elements and the light-emitting regions includes a light-emitting layer, and a total area of the light-emitting layers of the light-emitting regions is greater than an area of the light-emitting layer of the first light-emitting element.

11. The micro LED display device of claim 9, wherein the second light-emitting element further comprises an insulating structure, a separation space is defined between the light-emitting region, and the insulating structure is arranged in the separation space between the light-emitting regions.

12. The micro LED display device of claim 9, wherein the second light-emitting element further comprises a conductive layer, and the conductive layer connects the light-emitting regions in a tandem structure.

13. A micro light-emitting diode (LED) display device, comprising:

a circuit substrate;

a circuit pattern disposed on the circuit substrate and comprising a plurality of first circuits and a plurality of second circuits, wherein electrical properties of the first circuits are different from electrical properties of the second circuits; and a plurality of sub-pixel units respectively arranged on the circuit pattern, wherein at least one of the sub-pixel units comprises:

a first light-emitting element electrically connected to one of the first circuits and one of the second circuits, wherein the first light-emitting element comprises two sub first light-emitting elements, and projections of the sub first light-emitting elements on the circuit substrate are overlapped with projections of the electrically connected first circuit and the electrically connected second circuit on the circuit substrate, respectively, and a second light-emitting element, wherein a luminous color of the second light-emitting element is same as a luminous color of the first light-emitting element, the second light-emitting element is electrically connected to one of the first circuits and one of the second circuits and is connected in parallel with the first light-emitting element, the second light-emitting element comprises two sub second light-emitting elements, and projections of the sub second light-emitting elements on the circuit substrate are overlapped with projections of the electrically connected first circuit and the electrically connected second circuit on the circuit substrate, respectively.

14. The micro LED display device of claim 13, wherein each of the sub first light-emitting elements and the sub second light-emitting elements comprises a light-emitting layer, and a total area of the light-emitting layers of the sub second light-emitting elements is greater than or equal to a total area of the light-emitting layers of the sub first light-emitting elements.

* * * * *